United States Patent
Schallenberg et al.

(10) Patent No.: US 11,876,533 B2
(45) Date of Patent: Jan. 16, 2024

(54) METHOD FOR COMPUTER-ASSISTED OPERATION OF A MEMORY UNIT AND EXECUTION OF APPLICATION PROGRAMS WITH MEMORY CHECKING FOR MEMORY ERRORS

(71) Applicant: Siemens Mobility GmbH, Munich (DE)

(72) Inventors: Andreas Schallenberg, Peine (DE); Markus Seemann, Braunschweig (DE); Stefan Gerken, Braunschweig (DE)

(73) Assignee: Siemens Mobility GmbH, Munich (DE)

( * ) Notice: Subject to any disclaimer, the term of this patent is extended or adjusted under 35 U.S.C. 154(b) by 0 days.

(21) Appl. No.: 18/305,531

(22) Filed: Apr. 24, 2023

(65) Prior Publication Data

US 2023/0344448 A1  Oct. 26, 2023

(30) Foreign Application Priority Data

Apr. 22, 2022  (EP) ..................................... 22169515

(51) Int. Cl.
*H03M 13/00* (2006.01)
*H03M 13/09* (2006.01)

(52) U.S. Cl.
CPC ....... *H03M 13/095* (2013.01); *H03M 13/611* (2013.01)

(58) Field of Classification Search
CPC ........................... H03M 13/095; H03M 13/611
See application file for complete search history.

(56) References Cited

U.S. PATENT DOCUMENTS

| 8,090,983 | B2 | 1/2012 | Weiberle et al. | |
|---|---|---|---|---|
| 2016/0299812 | A1* | 10/2016 | Olbrich | G06F 3/061 |
| 2021/0091792 | A1* | 3/2021 | Kifune | H03M 13/45 |
| 2021/0248035 | A1* | 8/2021 | Eom | G06F 13/28 |

FOREIGN PATENT DOCUMENTS

| DE | 10219501 A1 | 11/2003 |
|---|---|---|
| DE | 102007040721 A1 | 6/2008 |
| DE | 102014114157 A1 | 3/2016 |
| WO | WO 2006045785 A1 | 5/2006 |
| WO | WO 2014009243 A2 | 1/2014 |

* cited by examiner

*Primary Examiner* — Christine T. Tu
(74) *Attorney, Agent, or Firm* — Laurence A. Greenberg; Werner H. Stemer; Ralph E. Locher

(57) ABSTRACT

In a method for computer-assisted operation of a memory unit, encoded data is saved in the memory unit. The data is retrieved and decoded after retrieval. The memory unit is monitored for errors in that a temporal sequence of computer-assisted checking operations is carried out for the memory unit. For first-time encoding of the data, each required application data set is generated or selected, containing check data segments. For each application data set, the check data segment is occupied by count data, which characterizes the checking operation being implemented. After retrieving and decoding the application data sets, an error is determined when the count data characterizes neither the checking operation being implemented nor the most recent completely implemented checking operation. The check data segment of the relevant application data set is occupied by count data, which characterizes the checking operation being implemented, if no error was determined.

15 Claims, 6 Drawing Sheets

METHOD FOR COMPUTER-ASSISTED OPERATION OF A MEMORY UNIT AND EXECUTION OF APPLICATION PROGRAMS WITH MEMORY CHECKING FOR MEMORY ERRORS

CROSS-REFERENCE TO RELATED APPLICATION

This application claims the priority, under 35 U.S.C. § 119, of European Patent Application EP22169515.8, filed Apr. 22, 2022; the prior application is herewith incorporated by reference in its entirety.

FIELD AND BACKGROUND OF THE INVENTION

The invention relates to a method for the computer-assisted operation of a memory unit, wherein data is saved in the memory unit and the data is encoded before saving, data is retrieved from the memory unit and the data is decoded after retrieval. The memory unit is monitored for errors in that a temporal sequence of computer-assisted checking operations is implemented for the memory unit. In addition, the invention relates to a method for the computer-assisted execution of an application program, wherein a memory unit is operated in the manner described above and wherein application data sets required for the execution are retrieved from the memory unit and decoded. Finally, the invention relates to a computer program product and to a provision apparatus for the computer program product. The computer program product is furnished with program commands for carrying out this method.

In principle, safety-relevant systems, which run in a safety-relevant computing environment in a computer-assisted manner, have to guarantee that no errors occur when retrieving data from a memory unit. Corrupt data may not be used for data processing. Within the framework of this invention, safety-relevant is taken to mean the relevance for the operational safety of the system (also called safety). For example, railroad applications are considered to be safety-relevant systems within the meaning of the term.

To safeguard safety-relevant computing environments it is known that reliably only those components which are used for processing the relevant application are installed on a computer in a plurality of computing instances. When the application then runs in parallel in a plurality of computing instances, it is possible to determine by way of voting and in a manner known per se whether errors occur in the calculation. Storage errors, i.e., memory errors, can also be discovered in this way.

WO 2014/009243 describes a method and a computer, which have a checking algorithm for processing applications in the computing environment formed by the computer. Application programs are installed on the computer, which are executed redundantly, so by comparing the calculation results it is possible for the checking algorithm to discover errors (as mentioned, also called voting). This method is connected with significant expenditure on hardware, however, and does not permit reliable error detection in the case of particular constellations, moreover.

SUMMARY OF THE INVENTION

It is accordingly an object of the invention to provide a method which overcomes the above-mentioned disadvantages of the heretofore-known devices and methods of this general type and which provides for a method for the computer-assisted operation of a memory unit and a method for computer-assisted execution of an application program, wherein such a memory unit is used with which it is possible to improve the reliability of checking memory for memory errors. It is a further object of invention to disclose a computer program product and a provision apparatus for this computer program product with which the above-mentioned method can be carried out.

With the above and other objects in view there is provided, in accordance with the invention, a method for computer-assisted operation of a memory unit, the method comprising:

saving data in the memory unit and encoding the data prior to saving;

retrieving the data from the memory unit and decoding the data after retrieval;

monitoring the memory unit for errors by carrying out a temporal sequence of computer-assisted checking operations for the memory unit;

for a first-time encoding of the data:
generating or selecting at least one application data set containing data segments having application data for an application program and check data segments;
occupying the check data segment of each application data set with count data that characterizes the checking operation being implemented; and
encoding and saving each application data set;

for checking the data in the checking operation being implemented, after retrieving and decoding the application data sets respectively:

determining an error for an application data set when the count data characterizes neither the checking operation being implemented nor a most recent completely implemented checking operation;

when no error was determined, occupying the check data segment of the relevant application data set with count data, which characterizes the checking operation being implemented; and encoding and saving the relevant application data set if no error was determined.

In other words, the objects of the invention are achieved with the claimed subject matter disclosed in the introduction (method for computer-assisted operation of a memory unit) in that, for first-time encoding of the data, at least one application data set, containing data segments having application data for an application program and check data segments is generated or selected, for each application data set, the check data segment is also occupied by count data, which characterizes the checking operation being implemented, each application data set is encoded and saved, and that for checking the data in the checking operation being implemented, after retrieving and decoding the application data sets respectively an error is determined for an application data set when the count data characterizes neither the checking operation being implemented nor the most recent completely implemented checking operation, the check data segment of the relevant application data set is occupied by count data, which characterizes the checking operation being implemented, if no error was determined, the relevant application data set is encoded again and saved if no error was determined.

Because a check data segment (which was generated in advance if there was still no check data segment, or was selected if there was already a check data segment available for the relevant data segment) is assigned to each of the data segments on first-time encoding, count data can be stored in the relevant data set, which data includes information about the checking operation being implemented. The count data and also the other data of the relevant data segment is protected up until decoding against access by way of the subsequent encoding of the relevant data set. In the encoded state the data namely cannot be accidentally (for example due to a malfunction) or deliberately (for example due to an external attack) changed without a change being identified as an error on decoding of the data. At any rate it is extremely improbable that the change does not turn out to be an error on decoding of the data set. In this respect there is no protection against changes per se but only against undiscovered changes. What are known as sleeping errors are also discovered by the cyclical checking of the memory content for correct encoding (using the count data). This means errors, which can occur during storage of the data, for example due to physical changes in the storage medium. The low probability of not discovering errors makes it inventively possible to adhere to higher safety levels (safety integrity levels, SIL-1 . . . SIL-4).

Preferably all data that the application program requires is protected in the data set, that is to say, both the data which makes up the program per se and the data which represents information to be processed.

For example, it is possible that the count data is changed owing to storage errors, in other words, errors which occur during storage of the data on a memory unit (for example, what are known as bit flips) or owing to processing errors, in other words, errors which occur during processing of the data set. Such a change is then determined when running through the next checking operation, however, if the count data characterizes neither the checking operation being implemented nor the most recent completely implemented checking operation. An error is determined in such a case. Even if the cause thereof perhaps cannot be clearly determined and would be potentially harmless for data processing, for reasons of the safety level to be achieved, after this error has been determined it is, for example, output and/or measures are taken, which prevent further processing of the erroneous data.

Only if no error is determined is the count data in the check data segment occupied by the count data of the checking operation being implemented, the data set encoded and stored again. The relevant data set is hereby simultaneously characterized as checked in the relevant checking operation (wherein one possibility as to how data sets outside of a checking operation can also be occupied by the current count data in the check data segment will be explained later).

Count data has to have the property that it forms a series in which the precursor and the successor respectively of each element of the set of count data is known. In principle, all mathematical series can be used here. The set of natural numbers can be particularly preferably selected.

To implement the checking operation an application program is preferably used, which implements the checking operation. For this purpose, the relevant application program, which can also be referred to as a checking program, accesses the memory unit, decodes, checks and encodes data set for data set until a checking operation has been completely implemented. For the case where an error is determined, the error can be output by the checking program. The checking program can also contain functions, which contain a reaction to a determined error, for example suspension of an application program, which uses the erroneous data segments of the application (also called application data segments) and could therefore potentially make safety-relevant errors. Different sources of error can become evident hereby.

The implementation of the checking operation can be controlled, for example, via the addressing of the individual data sets. If the addresses of all data sets are known at the start of the checking operation, the data sets can be sequentially retrieved until the checking operation has ended (more on this below).

If a checking operation is erroneously implemented as a whole to the extent that it does not check all data sets of a checking operation, then this becomes apparent at the latest on the next checking operation, at least provided that the unchecked data sets are checked again in the following checking operation. These then namely still have the count data of the penultimate checking operation, and this becomes apparent during the following checking operation. An error is identified hereby and output. The count data therefore also enables monitoring of proper implementation of the checking operations themselves. A further source of error becomes evident thereby. Data which is categorized as outdated, and therewith potentially erroneous (because it is not regularly checked in a checking operation), is not safe enough with regard to its integrity, for which reason it is classified as an error.

This creates a safety mechanism, which increases operation of the memory unit and the execution of application programs (these are service programs or utility programs, more on these below) within the meaning of the statement of the object. Safety-relevant applications in particular, for example railroad applications, which as a condition of admission have to satisfy particular safety levels (also called safety level, SIL-1 . . . SIL-4 or Safety Integrity Level), advantageously benefit from this increase. Within the framework of this invention the term "safety" should be taken to mean operational safety. In particular, encoding takes place primarily from operational safety perspectives and not from transmission security perspectives. Inventively, an encoding method is therefore preferably provided, which achieves a high level of performance during encoding and decoding (with the effect of short encoding and decoding times) and does not guarantee a high level of difficulty to decrypt encoding without authorization.

In general, with the inventive method for operation of the memory unit and for execution of application programs, by way of checking of the data segment, containing data for the application programs, and checking of the data segment, containing further criteria, which facilitate checking, it is possible to determine which data sets are actually, or at least potentially, corrupt and therefore jeopardize operational safety when the application programs are executed, in particular the utility programs. The affected data sets are characterized by output of an error and are preferably excluded from data processing in the further course of the method.

In other words, the operational safety is, as it were, inventively coupled to the data sets themselves. For this purpose, the data sets are inventively provided with suitable check data segments. This advantageously makes it possible for the data sets to be saved on one and the same memory unit even if processes run in parallel for reasons of operational safety. In particular, commercially obtainable software and hardware components, so-called COTS components (COTS—Commercial Off-The-Shelf) can consequently be used for storing the data sets and for executing the application programs without the operational safety requirements being jeopardized hereby. Components of this kind can be used, for example, also in railroad engineering applications therefore and replace proprietary systems. Advantageously, COTS components are inexpensive to acquire and can also be replaced more easily if needed and can be integrated in cloud solutions.

In connection with the invention, the terms "computer-assisted" or "computer-implemented" can be taken to mean an implementation of the method, wherein at least one computer or processor executes at least one method step of the method.

In connection with the invention, the term "computing environment" can be taken to mean an infrastructure, comprising components such as computers, memory units, programs and data to be processed with the programs, which are used for execution of at least one application, which has a task to fulfil. The infrastructure can also comprise, in particular, a network of said components.

Within a computing environment, the term "computing instance" (or instance for short) can be taken to mean a functioning unit, which can be assigned to an application and can execute this application. When the application is executed, this functioning unit forms a physical and/or virtual self-contained system.

The expression "computer" covers all electronic devices having data processing properties. Computers can be, for example, personal computers, servers, handheld computers, mobile radio devices and other communication devices, which process data in a computer-assisted manner, processors and other electronic devices for data processing, which can also be joined together, preferably via interfaces, to form a network.

In connection with the invention, the term "processor" can be taken to mean, for example, a converter, a sensor for generating measuring signals or an electronic circuit. A processor can be, in particular, a Central Processing Unit, a microprocessor, a microcontroller, or a digital signal processor, possibly in combination with a memory unit for storing program commands and data. A processor can also be taken to mean a virtualized processor or a soft CPU.

In connection with the invention, the term "memory unit" can be taken to mean, for example, a computer-readable memory in the form of a Random-Access Memory or data memory (hard disk or data carrier).

"Interfaces" can be implemented in terms of hardware, for example wired or as a radio connection, and/or in terms of software, for example as an interaction between individual program modules or program parts of one or more computer program(s).

"Cloud" should be taken to mean an environment for "Cloud Computing" (also referred to as computer cloud or data cloud). What is meant is an IT infrastructure, which is made available via interfaces of a network such as the Internet. As a rule it includes memory space, computing power or software as a service without these having to be installed on the local computer using the Cloud. The services offered in the framework of Cloud computing comprise the entire spectrum of information technology and includes, inter alia, infrastructure, platforms and software.

"Program modules" should be taken to mean individual functional units, which enable an inventive program sequence of method steps. These functional units can be implemented in a single computer program or in a plurality of computer programs that communicate with each other. The interfaces actualized here can be implemented in terms of software inside a single processor or in terms of hardware if a plurality of processors is used.

Unless disclosed otherwise in the description below, the terms "create", "determine", "calculate", "generate", "configure", "modify" and the like preferably refer to processes, which generate and/or change data and/or convert data into other data. The data is present, in particular, as physical variables, for example as electrical pulses or analogous electrical variables. The requisite instructions are combined in a computer program as software. Furthermore, the terms "transmit", "receive", "read in", "read out", "transfer" and the like refer to the interaction of individual hardware components and/or software components via interfaces.

According to one embodiment of the invention, it is provided that a start value is defined for the count data before first-time implementation of a checking operation.

The start value has to be an element of the series of numbers used. In particular, when using the natural numbers as count data, the start value is a natural number. It is advantageous to use a number not equal to one and, in particular when using a plurality of memory units, to use different start values because this additionally reduces the probability or random matches of incorrect count data of different memory units. The processing safety is advantageously further increased hereby since the probability of unidentified storage errors or processing errors occurring is further reduced.

According to one embodiment of the invention, it is provided that the checking operations respectively include at least the checking of all application data sets available at the beginning of the checking operation for the ongoing method.

In this embodiment of the method, it is determined at the start of the checking operation which data sets are to be checked. The ascertained number of data sets for checking is subsequently checked. Once all data sets for checking have been checked the checking operation is completed. The count data can then be occupied by the subsequent count element. By defining, as it were, the scope of checking of a checking operation and subsequent implementation thereof, the method of checking may advantageously be reliably carried out with little computing outlay.

Alternatively, it would also be possible, to purposefully check in a checking operation only those data sets, which were changed during the preceding checking operation. This would include monitoring the data sets for use or changes, however, and this would make the sequence of the method more complicated. In addition, storage errors such as bit flips can also occur while the stored data is not being accessed. The modification of data sets will be discussed in more detail below.

In principle, it is possible to implement a checking operation when precisely all data sets for checking are not required (retrieved and/or changed) by application programs. It is also possible, however, to implement the checking operation in parallel with application programs that are running, therefore while the application programs are accessing the entirety of the data sets being checked. In this case, data sets, which are currently being processed, cannot be checked (more on this below).

According to one embodiment of the invention, it is provided that as soon as a checking operation has been completed, the count data is occupied by a count element, which follows the count element for the previous occupation of the count data.

A checking operation has been completed when all application data sets, which the checking operation includes, have been checked. This means that monitoring takes place during the checking operation as to which application data sets have already been checked and which have not. This may be accomplished, for example, by means of the addresses of the application data sets with which the application data sets can be identified.

Once a checking operation has ended, and the count data, which has been made available to the application program for checking, has been occupied by the subsequent count element, the application program can then retrieve the updated count data in the subsequent checking operation. When checking the stored data sets it is then possible to check whether the data sets include the count data of the preceding checking operation respectively because the application program "knows" by way of the previous increase in the count data, as it were, the count element of the current checking operation. Since the count data is set to the current count element in the case of each checked data set (at least if no error was determined), the checking operations according to this method can be repeated as often as desired.

Alternatively, the object cited is inventively also achieved by the claimed subject matter disclosed in the introduction (method for computer-assisted execution of an application program) in that, for computer-assisted execution of an application program, wherein a memory unit is operated as explained above and wherein application data sets required for the execution are retrieved from the memory unit and decoded,
  after decoding of the application data sets the application program is executed,
  at least application data sets, which include data segments changed or generated by the execution of the application program, are encoded and saved in the memory unit.

The application program can preferably be executed step by step. This means that the application data sets necessary for the execution of the application program also have to be retrieved from the memory unit and encoded respectively at least only for the pending step of the application program. Of course, on execution of the application program the entirety of the application data sets necessary for execution of the application program is retrieved and decoded little by little and step by step.

Because the memory unit is operated as described above according to the method for computer-assisted operation of the memory unit, in other words application data sets, which include data segments changed or generated by the execution of the application program, are also occupied during encoding by the count data, which characterizes the current checking operation being implemented.

This has various advantages. If new data sets are created or data sets are changed (in other words, data in an existing data set, in particular the data segments having application data are changed), these are saved with count data, which is suitable for co-checking the corresponding data sets at least in the next checking operation. If the saved data sets are error-free, these are namely also furnished with the suitable count data in the next checking operation so they can be identified as being error-free.

This embodiment of the invention also has the advantage that data sets, which are not currently available for checking in the case of a checking operation running in parallel with data processing by application programs, can be skipped by the checking operation since they are occupied by current count data during execution by an application program, in particular by a utility program, which data enables checking in the subsequent checking operation even if checking (for example by a checking program) in the current checking operation is skipped owing to parallel processing by the application program (utility program or service program). This simplifies, in particular, the sequence of the checking operation considerably since the checking operation, when executing the check routine, can simply skip data sets being processed and a check does not have to be caught up on at a later instant of the current checking operation. This can be advocated from a safety perspective since the integrity of the data, while taking into account the count data, can also be implemented (or anytime soon in the next checking operation) by the application program and thus the relevant data set is kept up to date.

According to one embodiment of the invention, it is provided that when checking the data after decoding of the application data sets and before execution of the application program respectively
  an error is determined for an application data set when the count data characterizes neither the checking operation being implemented nor the most recent completely implemented checking operation,
  the application program is executed if no error has been determined.

In this embodiment of the invention, the advantages, which are achieved by regular checking of the data in the memory unit by means of checking operations, are additionally achieved in the processing of the data by an application program respectively. In other words, every time data is retrieved from the memory unit for processing, it is checked whether a storage error has occurred in the meantime. Additional safety is achieved hereby since even storage errors which randomly occurred in data sets between the last successful checking operation and the retrieval of the data set by an application program (in particular utility program) can be identified.

According to one embodiment of the invention, it is provided that additionally, during the computer-assisted operation of the memory unit, for first-time encoding of the data,
  at least one group of application data sets, containing data segments having identical application data for an application program and check data segments having different diversity characteristic data respectively is generated or selected from a supply of possible diversity characteristic data,
  each application data set is encoded and saved,
  and the data is retrieved in that the application data sets are retrieved and decoded, and the data is saved in that the application data sets are encoded and saved,
and/or
  during the computer-assisted execution, the application program is executed multiple times in redundant computing instances, wherein in order to execute required application data sets, each application data set of an encoded group of application data sets is retrieved from the memory unit and decoded, wherein
  in order to check the data after the decoding of the application data sets, an error is determined respectively for an application data set if the diversity characteristic data in the application data set deviates from all possible diversity characteristic data of said computing instance from the supply, i.e. from the supply provided for this computing instance,
  the application program with the data segments of each application data set of the relevant group is executed if no error was determined,
and/or at least application data sets, which due to the execution of the application program include changed or generated data segments, are encoded according to the manner mentioned above and saved in the memory unit.

As will be described below, this embodiment of the invention is an additional safety mechanism, which additionally further increases operation of the memory unit and execution of application programs within the meaning of the statement of the object of the invention. As already explained, safety-relevant applications, in particular, for example railroad applications, advantageously benefit from this increase. Only one of the errors described in the framework of this invention has to occur in order to bring about, overall, output of an error. The level of safety in the implementation of the application programs (utility programs) is thus increased independently of the inventive measures through which the error is identified. As already mentioned, the term "safety" is to be understood within the meaning of operational safety.

The formation of groups of application data sets, which contain data segments having identical application data respectively, has the advantage that computing operations, i.e., the execution of application programs, which use the respectively identical application data, can be carried out redundantly. Should an error be identified in one of the application data sets, the relevant application data set can be excluded from processing without the process sequence having to be interrupted immediately as a result because further application data sets are indeed available for carrying out the method, in other words, execution of the relevant application program.

The diversity characteristic data makes it possible to differentiate the application data sets with respectively identical application data from each other and enables an accurate assignment, for example to a computing instance provided for the relevant application data. It is hereby also possible to check whether an error (referred to as an assignment error) has crept in when application data sets are assigned to particular computing instances. Such an identified error can also trigger suitable reactions in the process sequence. For example, the incorrect assignment of application data sets can result in the relevant computing instances being excluded from implementation of the method. In this case too, the remaining computing instances can continue to operate the method, for which reason the method is not immediately interrupted.

If a plurality of application data sets is required for one application program (and this is the rule), then, in particular, each group of application data sets can receive the same diversity characteristic data again. These are selected from a supply of diversity characteristic data. In this way the assignment of application data sets to a particular computing instance having a particular diversity (in other words, a computing instance to which diversity characteristic data of a particular type is assigned from the supply) is by the diversity characteristic data. This already significantly increases the operational safety and owing to the limited supply of diversity characteristic data, may be implemented with little computing outlay.

Where reference is made in connection with this application to data in general, the data can have any desired content. In contrast, application data, diversity characteristic data, redundancy data, count data, etc. is taken to mean particular data, in other words, data for a specific purpose. A distinction is made, moreover, between variable data: this data is occupied or changed depending on runtime (in particular application data)

static data: program data (in particular, application data describing application programs).

The data segment, containing application data (called application data segment for short), can be executed (static data as instructions for the running of the application program) or processed (variable data, to be processed, for the application program). A check data segment, which preferably contains the diversity characteristic data and/or redundancy data and/or count data, is used preferably for execution by way of service programs, which run in order to check the integrity of the data (more on this below).

Encoded saving of the application data sets advantageously increases the probability of identifying data errors during processing (processing errors) or during storage. Even a single bit flip, for example during storage of the data, would lead to a different result during decoding, so the encoded application data set differs significantly from the application data set for encoding. If an error of this kind is discovered, the measures that have already been mentioned are carried out, so the method guarantees the requisite operational safety.

Use of the diversity characteristic data for identifying errors in the processing of the application data sets by way of an application program has already been explained in detail above. For the purpose of processing the application data sets, the data sets are decoded and, before they are saved in the memory unit stored again, are encoded again. In addition, it is possible that application data sets are changed by the execution of the application program or application data sets are formed with newly generated data segments. These are then encoded according to the above-mentioned storage method and saved in the memory unit.

During checking of the diversity characteristic data it is at least checked whether the identified diversity characteristic data of an application data set differs from all possible (in other words, possible for the relevant computing instance) diversity characteristic data of the supply. An error is then determined. If the diversity characteristic data corresponds to the anticipated diversity characteristic data, it is thus assumed that no error is present. Preferably, also only one type of diversity characteristic of the supply is permitted for one computing instance. However, it is also possible to reserve the computing instances in different regions for the purpose of better utilization of the computing instances for other diversity characteristic data respectively (more on this below).

When checking the data it is possible to check, for example, whether the diversity characteristic data in the application data set deviates from all possible diversity characteristic data from the supply, if it is in principle possible that all diversity characteristic data from the supply can be used for one particular computing instance. It is also possible, however, that particular diversity characteristic data from the supply is reserved for a particular computing instance. In this case, it is only checked whether the diversity characteristic data deviates from this reserved diversity characteristic data of the computing instance. The probability of discovering an error by determining incorrect diversity characteristic data advantageously increases in the process.

According to one embodiment of the invention, it is provided that the different diversity characteristic data of the supply includes different encoding constants and decoding constants.

The encoding constants are used in an encoding algorithm and the decoding constants in a decoding algorithm. Encoding algorithms and decoding algorithms of this kind are known per se. Encoding and decoding may advantageously be implemented with a high level of performance by means of the constants. This is merely a matter of attaining the operational safety, and not of obtaining adequate security against adversarial attacks which would only be possible with significantly greater computing outlay and, associated therewith, loss of computing performance.

If the encoding constants and decoding constants are simultaneously used as diversity characteristic data, then this has the advantage that the diversity of the application data sets is contained in the encoding. That is to say, for encoding and decoding a pair of constants is used, which simultaneously define the diversity of the relevant application data set. The constants thereby immediately fulfil two functionalities simultaneously, and this saves computing outlay and therefore increases the performance of the method.

According to one embodiment of the invention, it is provided that the diversity characteristic data includes an adjustment operator for adjusting the data segment generated by the decoding to the data segment before the decoding.

The adjustment operator is necessary if the information content (for example bit width) of the encoded and subsequently decoded application data set is greater than that of the encoded application data set. After decoding of the application data set, the superfluous information may not then be taken into account by the application to be carried out and has to be cut, as it were, by the adjustment operator. In general, the following functional equation thereby results for an encoding and decoding algorithm $$((AD\ opA\ C\_enc)opB\ C\_dec)opC\ Y == AD$$

where
AD application data set
opA encoding operator
C_enc encoding constant
opB decoding operator
C_des decoding constant
opC adjustment operator
Y desired information content According to one embodiment of the invention, the encoding operator is an instruction with which a multiplication is carried out.

According to a further embodiment of the invention, it is provided that the decoding operator (and in particular also the encoding operator) is an instruction with which a multiplication is carried out as a decoding operation (and, in particular, also as an encoding operation) and the adjustment operator is suitable, after the decoding, for limiting the data segment to its original length.

If a multiplication is selected as a decoding operator (and, in particular, also as an encoding operator), then this is an operation, which can advantageously be implemented in a computer with a high level of performance. In particular, if the decoding constant (and, in particular, also the encoding constant) are greater than 1 and are integers, the operation may be implemented particularly easily in terms of computing effort. However, due to the two-time multiplication, the length of encoded and subsequently of the decoded data segment becomes greater. After decoding, the actual information content of the data segment therefore has to be cut, as it were, from the overall result of decoding.

A modulo operation mod (also referred to as a length restriction operation) is preferably suitable for this purpose which, advantageously in the case of binary terms, cut the excess bits up to a desired bit width Y without changing the content of the bits of the remaining part. Additional memory space must be provided in the application data set for this data in order to store the excess information (redundant information) in the encoded state (because decoding is successful only with the aid of this redundant information). To increase the safety of the method still further, the data in the additional memory space, as redundancy data, can also be checked for errors (more on this below).

The following expression results for the above functional equation for the encoding and decoding by taking into account the multiplication as an encoding and decoding operation and the modulo operation as an adjustment operator:

$$(AD\ C\_enc\ C\_dec)\bmod Y == AD$$

where
AD application data set
C_enc encoding constant>1
C_dec decoding constant>1
mod Y modulo operation
Y desired bit width The encoding constant and the decoding constant are a pair of numbers, which, in particular, also characterizes the diversity of the relevant application data set. This pair of numbers is selected such when the application data set is multiplied by the encoding constant and the encoded application data set is subsequently multiplied by the decoding constant, the bits of the desired bit width Y of the application data again have the same values per bit. One encoding constant and one decoding constant each are available for each diversity in the supply for diversity characteristic data, which constants form one pair of numbers respectively with said properties. Experiments have shown that an encoding and decoding algorithm, which uses the most recently mentioned functional equation, can be carried out with a comparatively high level of performance with regard to computing speed.

According to one embodiment of the invention, it is provided that before encoding, the check data segment is created in such a way that it additionally has redundant memory space having predefined redundancy data.

As will be described below, this embodiment of the invention is an additional safety mechanism, which additionally further increases operation of the memory unit and the execution of application programs within the meaning of the object of the invention. As already explained, safety-relevant applications, in particular, advantageously benefit from this increase.

The gain in safety lies in that the predefined redundancy data in the method is also known, because it is predefined. Redundant in the case of the redundancy data means that it is not necessary for storage of the application data. The redundancy data is required for encoding, however, because the data volume increases in the process. The redundancy data is occupied by new data, which normally deviates from the predefined redundancy data. This new data is necessary for a subsequent decoding.

If a corresponding encoding or decoding algorithm, then the redundancy data is filled with the originally predefined data again after decoding, however. This means that an error is determined when this condition is not met.

Preferably, the predefined data can contain only zeroes or only ones. Filling with predefined data may be carried out particularly easily with little computing outlay in this way.

According to one embodiment of the invention, it is provided that the application data segments consist of data words.

A data word is a particular data volume, which a computer can process in the arithmetic-logic unit of the processor in one step. If a maximum data volume is meant, then its size, word width, processing width, or bus width will be stated. A data word can preferably have a word width of 32, 64 or 128 bits. If the application data segments consist of data words, this advantageously accelerates the execution of the individual method steps, whereby the inventive method can be carried out with an optimum level of performance.

According to one embodiment of the invention, it is provided that the method is carried out while simultaneously using at least two processors or processing cores.

As already mentioned, the processors can be embodied physically (also with processing cores) or virtually (for example, emulated). A plurality of processors or processing cores can advantageously be used, in particular, to carry out computing processes redundantly, in other words, in parallel and in particular also simultaneously, to attain additional safety with regard to the occurrence of errors when processing the application data sets. The occurrence of errors can be checked, for example, as will be explained in more detail below, by voting.

According to one embodiment of the invention, it is provided that the at least two processors or processing cores have shared access to one and the same memory unit.

Access to one and the same memory unit means that the at least two processors/processing cores use a shared memory unit, with the memory unit not stipulating a physical separation of memory areas for the one processor or the other processor. In other words, each processor can in principle access the entire memory area made available by the memory unit. This does not, of course, rule out particular memory areas being reserved, for example by the definition of memory addresses, for the one or the other processor. This reservation can be changed or cancelled without interventions in terms of hardware, however, so potentially the entire memory area is available to each of the processors.

Use of shared memory units for a plurality of processors advantageously facilitates use of COTS components. In addition, the acquisition of a shared memory unit is less expensive than when a separate memory unit is provided for each processor. Inexpensive solutions in particular may be implemented hereby.

According to one embodiment of the invention, it is provided that
- with multiply stored identical data segments and/or with multiply identically changed data segments, voting is carried out,
- if, owing to the voting, an error is identified, application data sets, which contain data segments causative of the error identification, are excluded from further processing.

Multiply stored identical data segments and/or multiply identically changed data segments occur when application data sets are redundantly stored and/or processed. The redundant data (in other words, the relevant application data segments) have to be identical, for which reason differences that occur can be identified by voting and be output as an error.

Carrying out voting in order to identify data errors is known per se. For example, it is possible to calculate independent application data sets in a plurality of, preferably three, parallel process sequences and to subsequently compare them in the framework of voting. The results are then only deemed to be trustworthy if at least the majority of the compared results matches. The parallel execution of an application by the computing environment can be carried out in the computing environment, in particular, by three application data sets processed in parallel. This can advantageously ensure that processing of a data set can be carried out without feedback respectively in respect of the other processing operations. Advantageously, the probability of errors occurring in the processing of an application data set having an effect on the processing of other data sets can thus be reduced as far as possible.

On determination of a data error in a checking operation or during execution of the application program or of a processing error during voting, further processing of the data can be prevented or at least suspended, or prevented or at least suspended only for applications, which attain or exceed a predefined safety level. This has the advantage that the computing capacity of the affected host computers continues to be available for non-safety-relevant applications. This means the applications can be carried out if errors that occur (for example a program crash) do not hold any safety-relevant risks (safety-relevant risks in the case of railroad applications are, for example, train collisions or other accidents).

In an advantageous variation, the first and the second of the application programs are stopped if the data segments to be compared do not match or the count data in the checking data segments pertaining to these data segments characterize neither the checking operation being implemented nor the most recent completely implemented checking operation.

Stopping the program sequence advantageously effectively prevents erroneous processing of the application from being continued. Following this the relevant application program (incl. subprograms, program complexes) can also be started again if the error has been rectified. Operation, for example of a railroad application, can continue while individual application programs or host computers are restarted, in particular if the application programs are executed redundantly to be able to carry out subsequent voting of the generated variable data.

According to one embodiment of the invention, it is provided that
- application data sets, which contain data segments causative of errors, are updated using the error-free data segments of the corresponding application data sets,
- the updated application data sets are again incorporated in further processing.

The corresponding application data sets, which contain relevant error-free data segments, are thus used for updating. This means that in the application data sets, the data segments having identical application data are selected, in other words, application data sets, which belong to the same group of application data sets. As already explained, these differ namely only by way of the check data segments, but not by way of the data segments representing the application data, in other words, application data segments, so they can be used, as it were, to repair the identified error—provided the error-free data segments could be identified by the voting.

Updating faulty data segments makes permanent operation of the computing environment possible. Otherwise, increasingly more application data sets would be blocked by determination of errors, so the method would no longer be permanently executable. Even voting could no longer be carried out at some point in the absence of redundancy when generating data.

Apart from voting, the redundancy of the data, however, also enables the operation of the computing environment, in other words, processing of application data sets, while errors in individual application data sets are determined and corrected. The latter are namely only excluded from processing until they have been repaired in accordance with the above method. During the exclusion of corrupt application data sets further redundant application data sets with data integrity exist, however, with which the method, without delays occurring in the application, can continue to be carried out. The repaired application data sets can then be activated later, for example in a break in operation.

Furthermore, a computer program product having program commands for carrying out said inventive method and/or its exemplary embodiments is claimed, wherein the inventive method and/or its exemplary embodiments respectively can be carried out by means of the computer program product.

Furthermore, a provision apparatus for storing and/or providing the computer program product is being claimed. The provision apparatus is, for example, a memory unit, which stores and/or provides the computer program product. Alternatively and/or in addition, the provision apparatus is, for example, a network service, a computer system, a server system, in particular a distributed, for example cloud-based, computer system and/or virtual computer system, which stores and/or provides the computer program product preferably in the form of a data stream.

The provision takes place in the form of a program data block as a file, in particular as a download file, or as a data stream, in particular as a download data stream of the computer program product. This provision can also take place, for example, as a partial download, however, which consists of a plurality of parts. Such a computer program product is read into a system, for example using the provision apparatus, so that the inventive method is implemented on a computer.

Once more in a simplistic summary: The subject matter of the invention is a method for computer-assisted operation of a memory unit, wherein data is saved in the memory unit and the data is encoded before saving, data is retrieved from the memory unit and the data is decoded after retrieval. The memory unit is monitored for errors in that a temporal sequence of computer-assisted checking operations is carried out for the memory unit. For first-time encoding of the data, each required application data set is generated or selected, containing check data segments. For each application data set, the check data segment is occupied by count data, which characterizes the checking operation being implemented. Each application data set is encoded and saved. For checking the data in the checking operation being implemented, after retrieving and decoding the application data sets respectively, an error is determined for an application data set when the count data characterizes neither the checking operation being implemented nor the most recent completely implemented checking operation. The check data segment of the relevant application data set is occupied by count data, which characterizes the checking operation being implemented, if no error was determined. The relevant application data set is encoded and saved again if no error was determined.

Other features which are considered as characteristic for the invention are set forth in the appended claims.

Further details of the invention will be described below with reference to the drawings. Identical or corresponding drawing elements are provided with identical reference characters respectively and will only be explained multiple times to the extent that differences emerge between the individual figures.

The exemplary embodiments explained below are preferred embodiments of the invention. In the exemplary embodiments, the described components of the embodiments represent individual features of the invention that are to be considered independently of each other respectively, which respectively develop the invention, also independently of each other, and should therewith also be regarded individually or in a combination different to that shown as an integral part of the invention. Furthermore, the described components can also be combined by with the features of the invention described above.

Although the invention is illustrated and described herein as embodied in a method for computer-assisted operation of a memory unit and execution of application programs having memory checking for memory errors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE FIGURES

FIG. 2, which consists of the partial

DETAILED DESCRIPTION OF THE INVENTION

Figure 1:
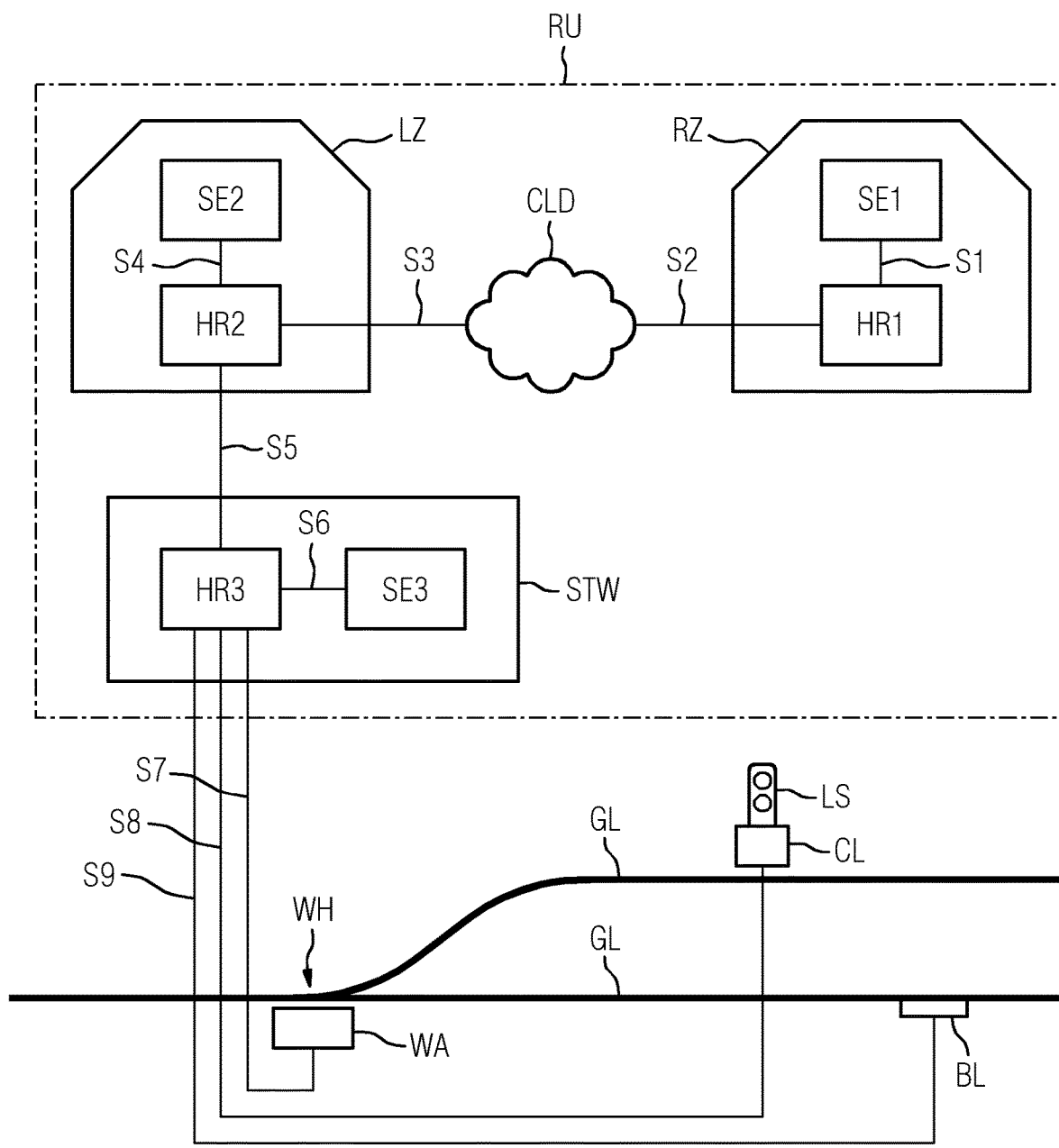
FIG. 1 is a schematic view of a railroad application having a computing environment with its cause-effect relationships, it being possible for an exemplary embodiment of the inventive method to be embodied with the computing environment.

FIG. 1 schematically represents a railroad application, which is controlled by a computing environment RU. The railroad application has rails GL on which various components of the interlocking engineering are represented by way of example. These are a switch drive WA, which can set a switch WH. Furthermore, a balise BL is installed in one of the rails, with the aid of which information can be exchanged with the trains traveling over the balise. Finally a light signal LS is represented, which is controlled by a controller CL.

The computing environment RU can have various host computers HR1, HR2, HR3 among which applications in the form of application programs for controlling the railroad application are distributed (more on this below). The first host computer HR1 is made available by a computing center RZ and is connected to a first memory unit SE1 by a first interface S1. The computing center RZ can be operated, for example, by a service provider of the rail operator or by the rail operator themselves. The first host computer HR1 is connected to a Cloud CLD by a second interface S2. Accordingly, this computer is not locally connected to the railroad application.

A control center LZ of the rail operator accommodates the second host computer HR2, which is likewise connected to the Cloud CLD by a third interface S3. In addition, the second host computer HR2 is connected to a second memory unit SE2 by a fourth interface S4.

The computing environment RU also has, by way of example, an interlocking STW (interlocking station, signal box, switch tower), which accommodates the third host computer HR3, which is connected to a third memory unit SE3 by a sixth interface S6. In addition, the third host computer HR3 has a fifth interface S5 to the second host computer HR2. The host computer HR3 can also be connected to the Cloud CLD. The third host computer HR3 also has a seventh interface S7 to the switch drive WA, an eighth interface S8 to the controller CL and a ninth interface S9 to the balise BL.

All interfaces S1 . . . S9 in FIG. 1 in principle can be implemented with cables or also by wireless transmission technology, for example radio. The arrangement of the host computers HR1 . . . HR3 is merely by way of example and can be expanded as desired with more complex railroad systems. A computing environment is defined in that the participating host computers HR1 . . . HR3 can communicate among themselves and the applications can thereby be executed by taking into account available computing capacities distributed among the host computers HR1 . . . HR3. Computing instances are formed for this purpose, and these will be described in more detail below (cf. FIG. 2 where the computing instances RP1 . . . RPn are represented).

Figure 2A:
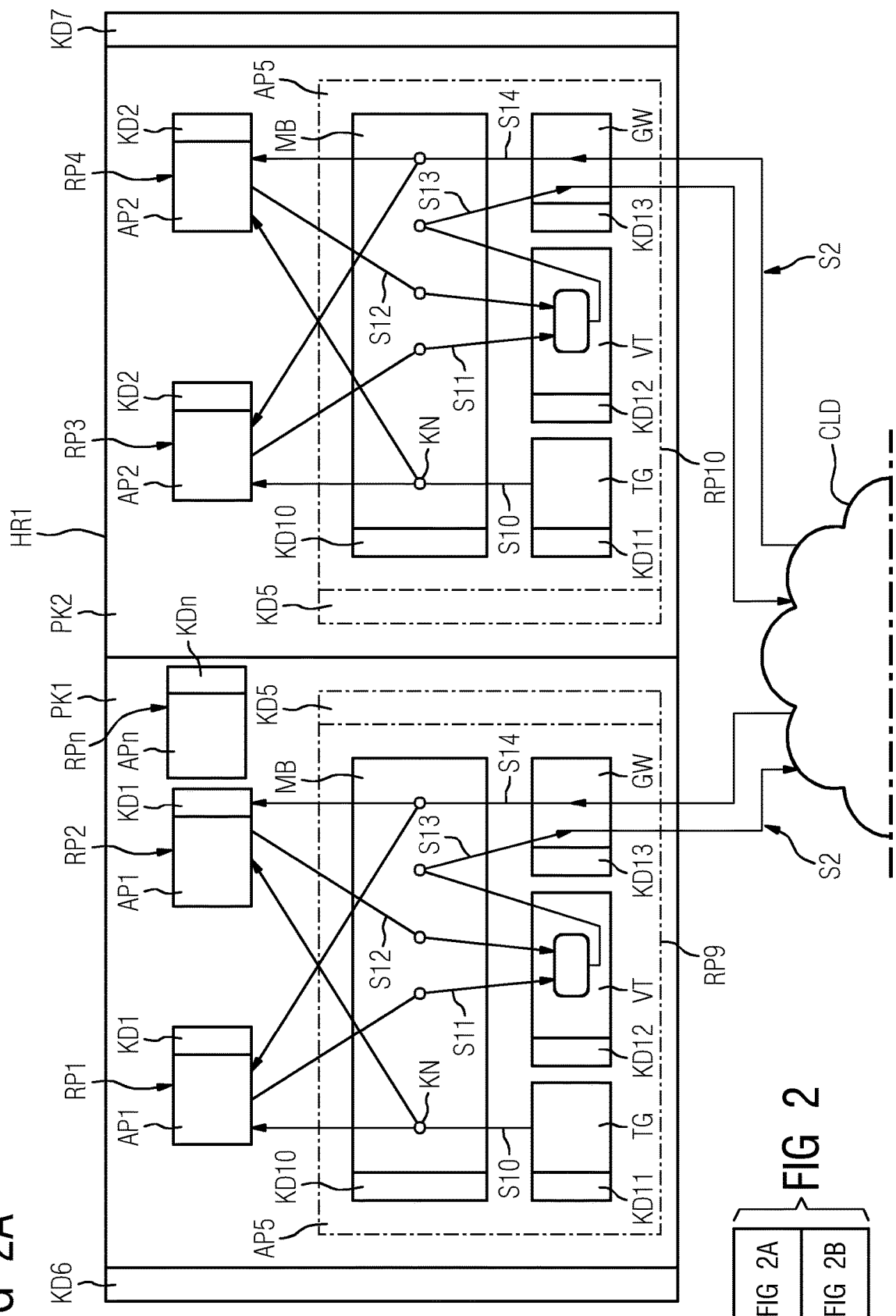
FIGS. 2A and 2B, shows a block diagram of an exemplary embodiment of the inventive method on the basis of a computing environment in the railroad application of FIG. 1, having two host computers, with the individual functional units containing program modules, which produce application programs and can run in one or more processors respectively and the interfaces can accordingly be embodied in terms of software or hardware.
Figure 2B:
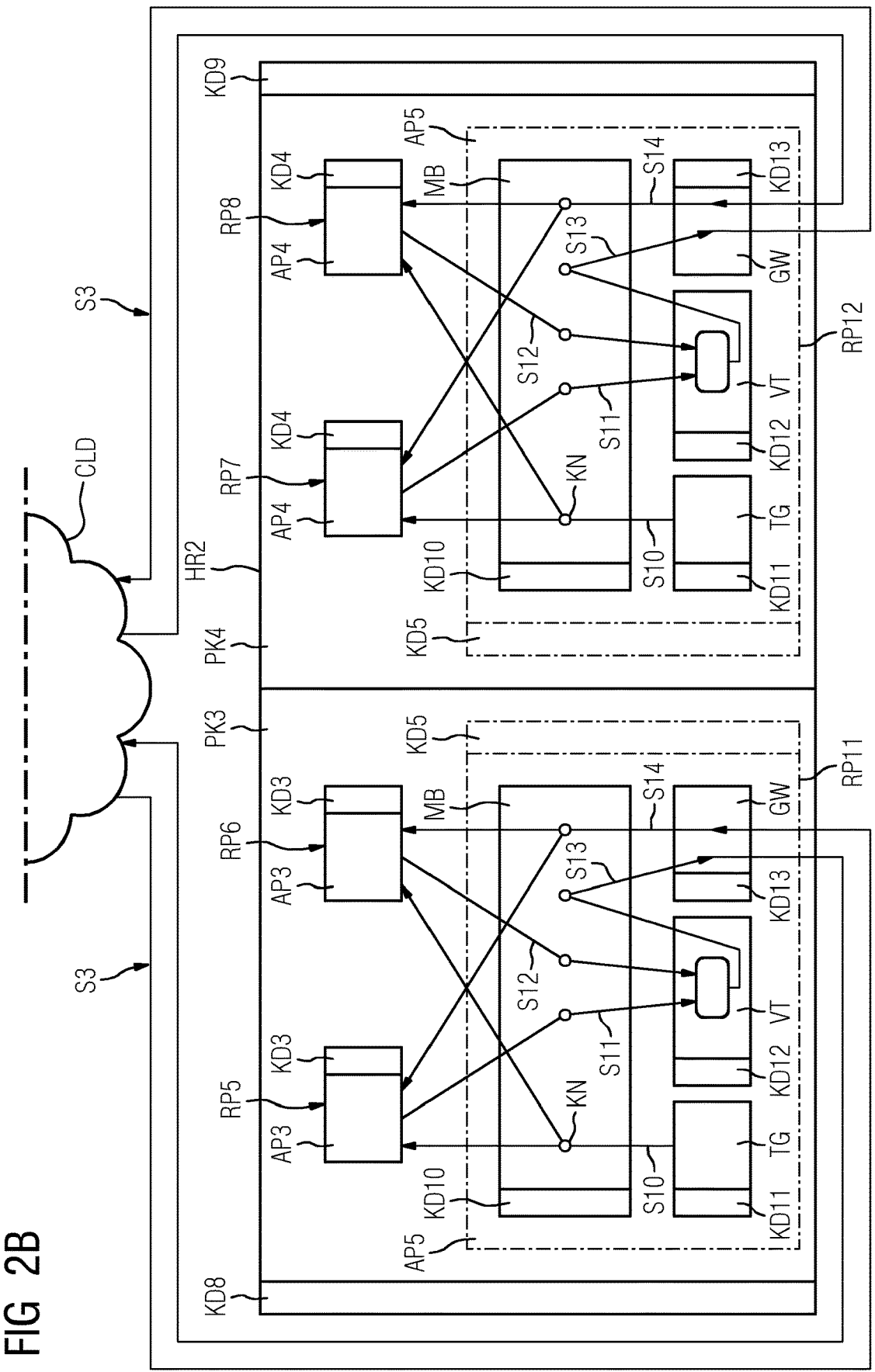

FIG. 2 represents the configuration of the first host computer HR1 and the second host computer HR2 of FIG. 1 by way of example. Further host computers can be incorporated analogously. The host computers are organized such that for the purpose of accomplishment, particular task complexes in the form of program complexes PK1, PK2, PK3, PK4 are organized on the host computers, and these consist of individual application programs AP1 . . . AP5.

Program complexes generally combine a number of application programs whose joint execution can be combined with a view to all of the applications. In particular, it can be provided that all application programs contained in one data set are combined to form one program complex. This takes account of the fact that with regard to the data being applied, the data set brings about combining of data segments while parallel herewith a program complex combines the corresponding application programs to which the data segments are assigned.

Configuration data KD1 . . . KD13 should be taken to mean data, which configures application programs for the individual demands of the individual application at hand. The configuration defines the interaction of different application programs among themselves and the function of the application programs on the hardware components on which they are installed. In addition, the configuration contains adjustments to the individual application at hand for which the relevant application program is intended (for example parameters, which can be differentiated in different individual applications).

On the basis of the fifth application program AP5 it is also shown that this can be implemented by individual subprograms. The subprograms of the fifth application program AP5 are a gateway GW, a voter VT, a clock TG and a message broker MB (more on this below). This should be understood merely as an example, however. Alternatively, the clock could run, for example, in a different application while the remaining subprograms run, as described, in the application program AP5.

Within the meaning of the invention, subprograms can, in general, be taken to mean smaller units such as program modules, the entirety of which produce the application program. It is thus advantageously possible to form application programs modularly, in other words, to provide, for example, program modules, which are used in a plurality of application programs. The subprograms can be configured with different configuration data, depending on their use. Subprograms thus make it possible to be able to create application programs more easily and therewith be able to adjust the computing environment more easily to an individual application.

In connection with the creation of program complexes, application programs and subprograms it should be noted that configuration data respectively can be assigned to the program complexes, the application programs and the subprograms respectively. Multiple storing of particular data with the same content can occur in this case, with this respectively producing data segments, which can, in turn, be uniquely assigned to a program complex, application programs or subprograms. The possibility of unique assignment in order to have available uniquely addressable data segments for implementing test functions is important here.

The fifth application program AP5 is identically organized in all program complexes PK1 . . . PK4. Messages can be exchanged with the Cloud CLD via the gateway GW. The gateway GW thus embodies the interfaces S2 and S3 of FIG. 1. The messages are distributed within the program complexes PK1 . . . PK4 via the message broker MB, preferably according to the Publish-Subscribe method. The gateway GW uses, for example, an interface S14 to make received messages to redundant computing instances RP1 . . . RPn available via the message broker MB. These messages are then retrieved by the redundant computing instances RP1 . . . RPn. This is indicated by nodes KN, which are indicated in the interface S14 (and likewise in the further interfaces S10 . . . S13 described below).

In FIG. 2 the program complexes PK1 . . . PK4 are completely implemented in one host computer HR1 . . . HR2 respectively for the sake of clarity. In reality, program complexes with their application programs AP1 . . . AP5 and the subprograms thereof can also run distributed among a plurality of host computers. This advantageously makes it possible to use capacities of host computers when they do not make sufficient capacity available for the configuration of an entire program complex in that the capacity of a plurality of host computers is jointly used for the relevant program complexes.

The program complexes can be provided, for example, for a particular task complex. For example, a program complex can be used for actuation of a particular railroad component (signal, interlocking, switch, axle counter, etc.). Generally a plurality of application programs is necessary for actuation of these railroad components. In particular, application program AP5 (already explained above) is also required to guarantee safe execution of the application and communication with other host computers. This should be referred to as a service program, which serves to safeguard the function of the host computer and therewith executes an application relevant to the host computer (in contrast to the useful data for application programs AP1 . . . AP4 processing railroad components, which are thus referred to as utility programs). The application program AP5 likewise runs in at least one computing instance RP9 . . . RP12 per host computer, although preferably not redundantly.

Within the meaning of the invention, a large number of redundant computing instances is taken to mean a software implementation on the host computers HR1 . . . HR3, which allow parallel, in other words, simultaneous execution of application programs AP1 . . . AP4, preferably within the respective program complex PK1 . . . PK4. FIG. 2 represents program complexes each having two redundant computing instances, although three redundant computing instances are preferably used, although more redundant computing instances RP1 . . . RPn, as represented, by way of example, for the first program complex, are also conceivable. The method for executing the application programs using the first program complex PK1 will be explained below for the first redundant computing instance RP1, the second redundant computing instance RP2 . . . and the nth redundant computing instance for executing the first application program AP1. Execution runs accordingly for the program complexes PK2 . . . PK4, however, so these do not have to be explained separately.

The first application program AP1 is executed redundantly, therefore simultaneously in parallel, in the first redundant computing instance RP1, . . . and the nth redundant computing instance RPn. This is an application program, which undertakes a task for the railroad application of FIG. 1. First configuration data KD1 is available from the first redundant computing instance RP1 through to the nth redundant computing instance RP2, moreover, which data is necessary for execution of the first application program AP1 in order to execute the individual task of the railroad application. For example, the first application program AP1 can in general serve to actuate light signals, with the first configuration data KD1 guaranteeing the application of the first application program AP1 to the light signal LS of FIG. 1. For example, communication with the controller CL of FIG. 1 has to be ensured for this.

Configuration data KD1 . . . KD13 is also available for all other program complexes PK1 . . . PK4, application programs AP1 . . . AP4 and subprograms MB, TG, VT, GW. Accordingly, the configuration data KD1 . . . KD13 contains the data necessary for the program complexes, application programs and subprograms respectively, so they can undertake the tasks assigned to them in the relevant individual application. The configuration data is constant respectively and can therefore be stored in a data segment with known start and known end. Similarly, all program complexes PK1 . . . PK4, application programs AP1 . . . AP4 and subprograms TG, VT, GW, MB are stored as data segments having known start and known end. For example, the first memory unit SE1, the second memory unit SE2 and the third memory unit SE3 of FIG. 1 are available for this. Data, which is stored in one of said memory units or remains stored in one of said memory units over a certain period, is subject to regular checking operations by way of which storage errors in the stored data can be identified (more on this below). Memory errors are taken to mean errors, which occur or arise in the data when saving or when retrieving the data while the data is being stored in the memory unit.

Data which changes during the execution of programs is exchanged between the participating partners as messages. As already mentioned, the message broker MB is available for this. In addition, the individual host computers HR1, HR2 communicate among themselves via the external interfaces S2, S3, for example by means of a Cloud CLD, so data can also be exchanged between different program complexes PK1 . . . PK4 of different host computers. After modification of the data, the data is saved in the first memory unit SE1, the second memory unit SE2 or the third memory unit SE3 again. Errors in the data can also occur during processing, which errors will be referred to more precisely as processing errors within the framework of this invention.

The sequences in the railroad application of FIG. 1 are relevant to the operational safety of the railroad application. This is why the first application program AP1 is executed simultaneously in parallel, in other words, redundantly, in the redundant computing instance RP1 through to the nth redundant computing instance RPn. The first redundant computing instance RP1 and the second redundant computing instance RP2 send the result during execution of the application to the message broker MB, and, more precisely, the first redundant computing instance RP1 via the eleventh interface S11 and the second redundant computing instance via the interface S12. These results are retrieved via said interfaces by the voter VT, which carries out voting. Only when the majority of the results match (that is to say, in the case of two redundant computing instances, both results, in the case of three redundant computing instances, at least two results, in the case of four redundant computing instances, at least three results, . . . in the case of n redundant computing instances, at least $n/2+1$ in the case of even n and $n/2+0.5$ in the case of odd n), is the result made available to the message broker via the thirteenth interface S13 and is it possible for it to be retrieved by the gateway GW via the thirteenth interface S13 for transmission to other units via the second interface S2.

So the calculation results are simultaneously available for voting by the voter VT, the processes are clocked in the first redundant computing instance RP1 and in the second redundant computing instance RP2 by the clock TG. This makes clock signals available via the tenth interface S10, and these can likewise be retrieved by the first redundant computing instance RP1 and the second redundant computing instance RP2 via the message broker MB.

The illustrated manner of executing tasks by the first application program AP1 and the second application program AP2 is ensured by the fifth application program AP5. The fifth application program AP5 is therefore an internal application program, which supports the functioning of the host computers HR1 . . . HR3. This makes it clear that application programs have to be made available not only for the application of the railroad application of FIG. 1 (utility programs), but also for the execution of applications in the host computers HR1 . . . HR3 (service programs).

The combination of application programs to form program complexes and the division of application programs into subprograms facilitates the compiling of application programs and the checking of the execution of tasks for freedom from errors in this connection. For this purpose, data is combined to form data segments, which can be uniquely identified and addressed as such respectively (by way of definition of a start of the data segment and an end of the data segment). As already mentioned, subprograms, application programs, program complexes and the respectively associated configuration data (with these usually comprising a large number of data segments) are defined in data segments. Here the necessary data is preferably stored several times using the diversity characteristic data, so the data segments and configuration files can be uniquely assigned respectively. In other words, the situation where different application programs, if they use identical configuration data, access the same memory location for this data does not occur in this case. Instead they always access the data segment assigned to them respectively in which the data is available.

Figure 3:
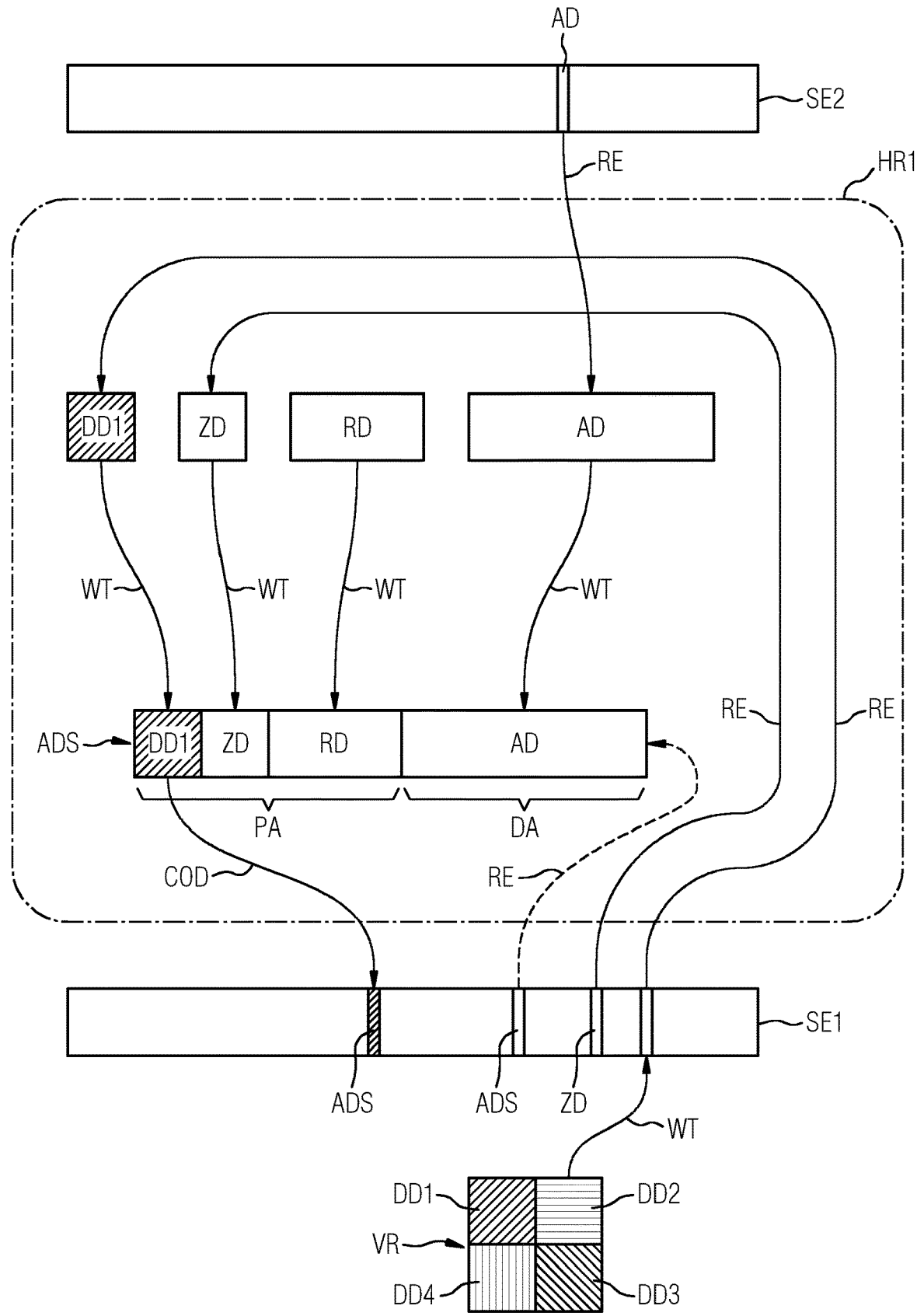
FIG. 3 is a schematic illustration of an exemplary method step for the first-time encoding of data according to the invention.

FIG. 3 schematically represents the method step of first-time encoding of data according to the invention. This is represented for a computing environment consisting of, for example, the first host computer HR1, the first memory unit SE1 and the second memory units SE2. In principle, the first host computer HR1 can access data, which is stored in the first memory unit SE1 and in the second memory unit SE2. Reading RE and writing WT can take place, and this is indicated by corresponding arrows.

For example applications AP for carrying out application programs can be stored in the memory units SE1, SE2. Furthermore, it is possible to store count data ZD and a supply VR of diversity characteristic data DD1 . . . DD4. To use the application data AD for applications within the meaning of the invention, in other words, to inventively carry out a method for computer-assisted execution of an application program, the application data AD has to be stored in the form of application data sets ADS, which are created by means of the method of FIG. 3 and are stored in an encoded manner by way of encoding COD.

FIG. 3 represents merely by way of example how the application data AD, the count data ZD and the diversity characteristic data DD1 . . . DD4 occupy individual memory areas of the first memory unit SE1 and the second memory unit SE2. In principle it is arbitrary where the corresponding data is saved; it is located by a suitable addressing and there are no restrictions as to which application data set ADS is stored where in the memory units SE1, SE2.

Furthermore, the diversity of the diversity characteristic data DD1. . . DD4 is indicated by hatched areas, and this is intended to make it clear that application data sets ADS can be characterized by the diversity characteristic data from the supply VR. As shown by the supply VR, a lengthwise hatching, a cross hatching and two instances of oblique hatching are available, which are at an angle of 90° to each other. The application data set ADS represented in detail in FIG. 3 has, for example, the hatching, which points to the diversity characteristic data DD1.

As the application data set ADS, which is represented in enlarged form, shows, it consists of one data segment DA for the application data AD and one check data segment PA, which has the first diversity characteristic data DD1, a count element in the count data ZD and redundancy data RD. The first diversity characteristic data DD1, the count data ZD, the redundancy data RD, which is occupied by a start value, and the application data AD are written in the host computer HR1, for example into a random-access memory, and are combined to form the application data set ADS. The application data set ADS is subsequently encoded and written into the first memory unit SE1, with the diversity on the basis of the first diversity characteristic data DD1 also being indicated in the memory unit SE1 by said hatching. The application data set ADS is available for further processing here.

Figure 4:
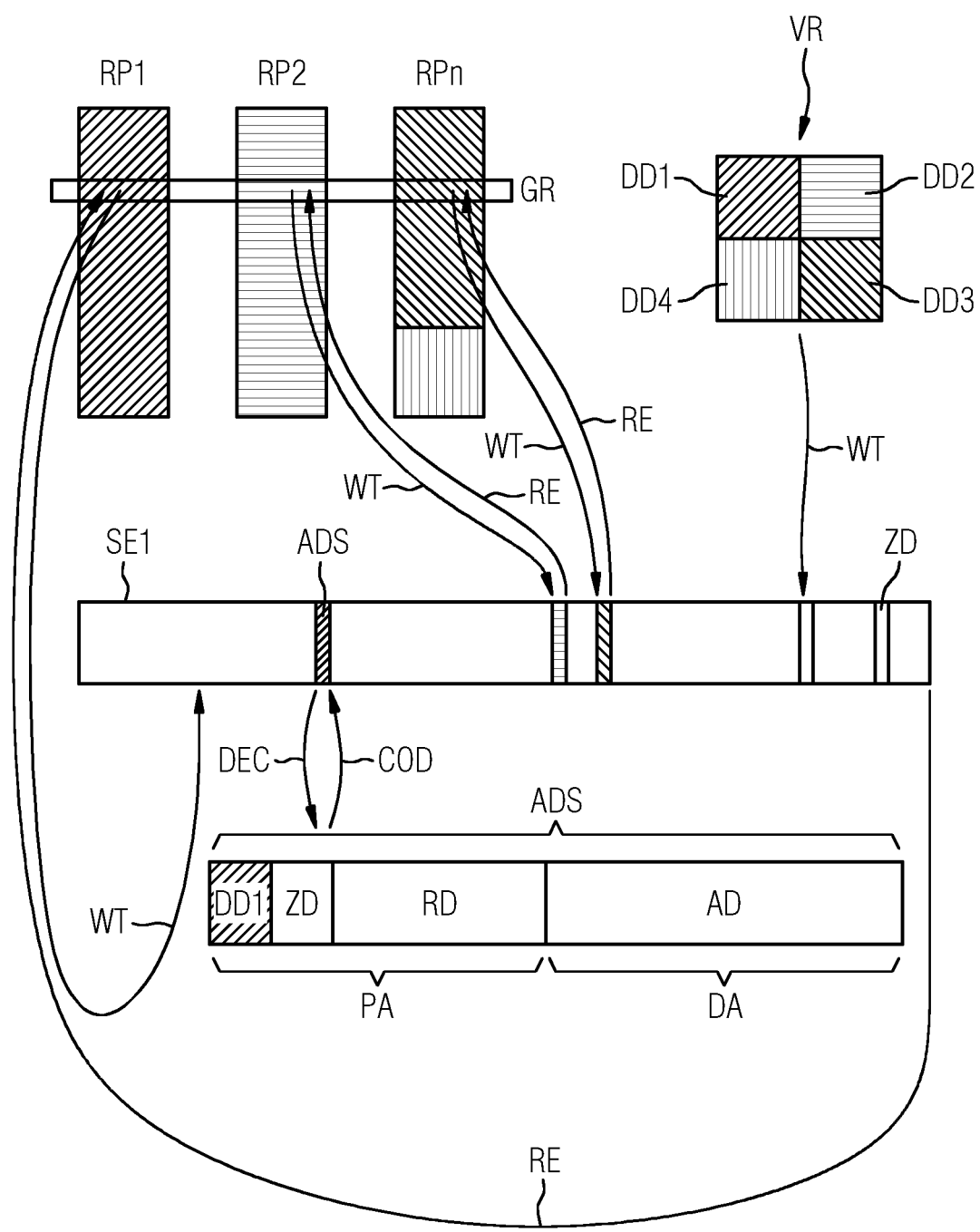
FIG. 4 is a schematic view showing the use of the application data set of FIG. 3 and further application data sets having second diversity characteristic data and third diversity characteristic data.

FIG. 4 schematically represents the use of the application data set of FIG. 3 and further application data sets having the second diversity characteristic data DD2 and the third diversity characteristic data DD3. The three represented application data sets ADS should contain identical application data. The check data segment PA is in each case occupied by the different diversity characteristic data DD1, DD2, DD3 respectively. The count data ZD and the redundancy data RD can also deviate from each other.

The application data sets ADS are now executed in three computing instances RP1, RP2, RPn (in the explained example n is equal to 3 but could also have a different value). For this purpose, the application data sets ADS are read into the computing instance respectively. One particular diversity respectively is assigned to the computing instances RP1, RP2, RPn, and this is represented by hatching accordingly. This hatching corresponds to that of the diversity characteristic data DD1 . . . DD3 of the supply VR respectively.

It can also be seen that a computing instance RPn can also process data from two diversities, in the present case the application data sets ADS characterized by the diversity characteristic data DD3 and the diversity characteristic data DD4. Optimum utilization of the computing capacity made available by the computing instance RPN can be achieved hereby.

The computing instances RP1 . . . RPn read out the application data sets ADS of the correct diversity respectively. This is achieved by service programs, which run in the background, so the computing instances RP1 . . . RPn are automatically supplied with the correct application data sets ADS. This is represented in more detail for the application data set ADS of FIG. 3 having the diversity characteristic data DD1 and shall be explained in more detail.

Once this application data set ADS has been retrieved it is firstly decoded in order to subsequently be read. By way of the decoding, the first diversity characteristic data DD1, the current count data ZD and the redundancy data RD together with the application data AD can be read out and service programs applied, which identify storage errors that have potentially occurred. It is possible to check whether the diversity characteristic data DD1 originates from the supply VR and/or matches the diversity of the first computing instance RP1. Using the count data ZD it is possible to check the proper course of checking operations since it has to characterize the checking operation currently taking place or the checking operation that previously took place. Only if the test shows that the data does not have any storage errors is it released for reading RE and processed by the first computing instance RP1.

After processing of the application data set ADS, the first computing instance RP1 writes the data set back into the first memory unit SE1. The check data segment, the first diversity characteristic data DD1, the count data ZD and the redundancy data RD can also be checked here in order to identify potential processing errors in the processing of the application data set ADS. In addition, the count data ZD is equated with the count element, which characterizes the checking operation that is currently running. The application data set ADS is subsequently encoded and written into the first memory unit SE1.

Even if it is not represented in detail, this method is likewise carried out for the further application data sets in the computing instances RP2, RPn. After successful processing of the application data sets ADS, voting can additionally be carried out for the application data AD to determine that the application data sets AD were identically changed also after processing by the computing instances RP1 . . . RPn. If this is not the case, then this points to a processing error. With three computing instances RP1 . . . RPn, a majority voting can be carried out, moreover, so the application data, which is identical for the most part, is used for further processing while the application data, which differs from it, is blocked for further processing.

One possible sequence for the method for computer-assisted operation of a memory unit and for computer-assisted execution of an application program shall be explained with reference to FIG. 5. Before the method is started an initialization step INI is carried out, with this permitting proper memory access to a memory unit. Once the method has started, the method for carrying out checking operations of the memory unit are represented here on the right-hand side and the execution of application programs on the left-hand side. These subsections can be carried out individually one after the other or preferably in parallel and are therefore shown side by side.

Firstly the method for carrying out the checking operation shall be explained. A start value is defined for the count data in a determining step for the count data DTM_ZD. This count data, in an output step for count data ZD_OT, if needed, is made available to the method for execution of an application program via an input step for count data ZD_IN.

Figure 5:
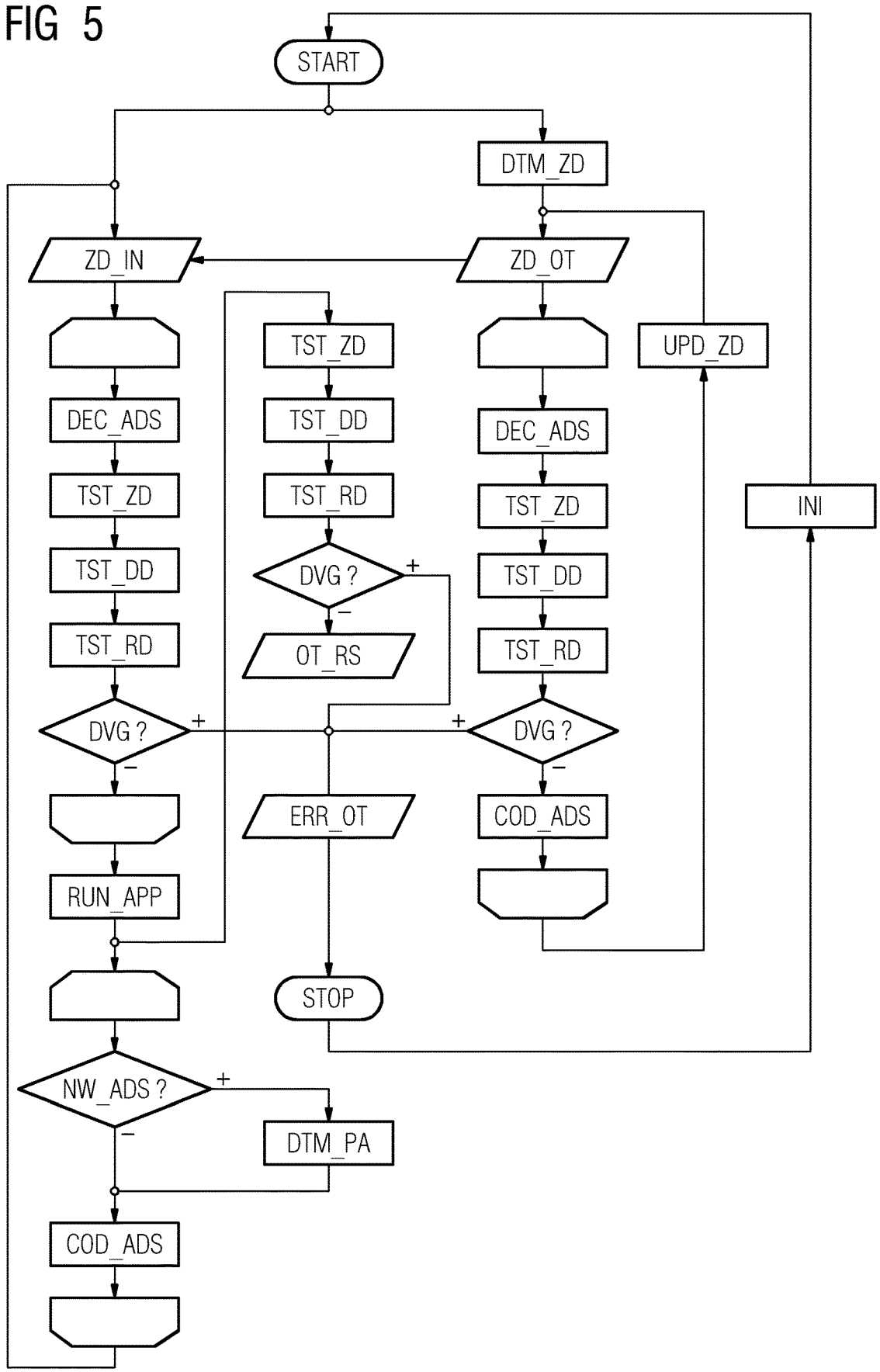
FIG. 5 is a process flowchart illustrating a possible sequence for the computer-assisted operation of a memory unit and for computer-assisted execution of an application program, wherein it is possible for the individual method steps to be implemented individually or in groups by program modules and with the functional units and interfaces shown in FIG. 2.

The actual checking operation consists of repeating procedures, which is carried out for all application data sets that are stored in the memory unit (represented on the right-hand side in FIG. 5). The following is carried out for each application data set with the current count elements of the count data:

The application data set is decoded in a decoding step for the application data set DEC_ADS. It is checked in a checking step for the count data TST_ZD whether the count element matches the checking operation currently being checked or the last checking operation. It is checked in a checking operation for the diversity characteristic data TST_DD whether the application data set has diversity characteristic data, which matches the available supply VT of diversity characteristic data (cf. FIGS. 3 and 4). It is checked in a checking step for the redundancy data TST_RD whether the redundancy data has an anticipated value, in particular an initial value.

Once all checking steps have been carried out, a query step checks for deviations DVG? whether one of the checking steps, as described above, has caused deviations from the anticipated result. If this is the case, an error is output in an output step for errors ER_OT (more on this below). If this is not the case, the checked application data set is encoded again in an encoding step for the application data set COD_ADS, with this data set always being encoded in the count data with the count element of the current checking operation. Once the checking operation has been carried out for all application data sets, they thus have the current count element in the count data, and the count data can be updated in an updating step for the count data UPD_ZD for the service program that is currently running to the extent that this data now includes the count element of the checking operation which will subsequently begin.

In the method for computer-assisted execution of an application program (left-hand side in FIG. 5), after the input step for the count data ZD_IN, which has already been mentioned, the decoding step for the relevant application data set DEC_ADS is repeatedly carried out for all required application data sets of the application carried out by the application program. Subsequently, as already described for the checking operation, a checking step for the count data TST_ZD, a checking step for the diversity characteristic data TSD_DD and a checking step for the redundancy data TSD_RD is carried out.

The special feature is that the application is carried out on a computing instance having a particular diversity, so the diversity characteristic data checked in the checking step for the diversity characteristic data TSD_DT must exactly match the diversity of the computing instance on which the application program is to be carried out.

During execution of the application program too, for each required application data set it is checked in the checking step for deviations DVG? whether the checking steps TST . . . have identified deviations from the anticipated contents of the application data sets. If this is the case, as already explained, an error is output in the output step for errors ERR_OT. Otherwise, checking of the application data sets is continued until all application data sets necessary for the application program have been checked. It is only under this precondition that the application program is executed in an execution step for the application program RUN_APP.

The application data sets can preferably be checked step-by-step for the application program (not represented in FIG. 5). That is to say, the execution of the application program is divided into execution steps. Within this meaning, all application data sets necessary for the application program, which are necessary for the next step to be carried out by the application program respectively, are to be checked. The relevant step of the application program is then executed in the execution step for the application program RUN_APP. A plurality of recursion loops, which, after the encoding step described below for the application data set COD_ADS (on the left-hand side of FIG. 5), again results in the input step of the count data is then produced for each application program in FIG. 5.

After the execution step for the application program RUN_APP, it is checked whether the application data sets that exist after the execution of the application program are new application data sets. This check (called query step of new application data set NW_ADS?) is necessary so in a determining step for a check data segment DTM_PA, new application data sets are assigned checking data, which makes subsequent checking of the application data set ADS in the further steps of the presented method possible. In each case, the new application data set or also the old application data sets are encoded again in the encoding step for application data sets COD_ADS and stored in the memory unit. A further application program or, as described above, a further step of an ongoing application program can be subsequently carried out (repetition of ZD_IN, input step for count data and the subsequent steps).

A plurality of application programs can also be executed simultaneously in redundant computing instances. In this case, the sequence for carrying out application programs would be represented multiple times next to one another in parallel, which is not represented here.

The implementation step for the application program RUN_APP can also achieve results which should be output. Before this occurs, a test procedure can optionally likewise be run through, represented in the center of FIG. 5. The steps that have already been explained, the checking step for the count data TSD_ZD, the checking step for the diversity characteristic data TSD_DD and the checking step for the redundancy data TSD_RD therefore, are carried out in this connection. In a subsequent query step for deviations DVG? it is again checked whether deviations could be determined in the checking steps. If this is the case, as already described, an error signal is generated in an output step for an error ERR_OT. Otherwise, the result is output and/or processed further in further steps in an output step for the result OT_RS.

For the case where an error is output in an output step for an error ERR_OT, the method is stopped immediately in the exemplary embodiment of FIG. 5. The computing environment can subsequently be reset by the initialization step INI and the method started again, for example.

The following is a summary list of reference numerals and the corresponding structure used in the above description of the invention:
LZ control center
STW interlocking
RZ computing center
GL rail
WH switch
WA switch drive
LS light signal
CL controller for light signal
BL balise
RU computing environment
HR1 . . . HR3 host computer
SE1 . . . SE3 memory unit
S1 . . . S14 interface
CLD Cloud
RP1 . . . RP8 RPn redundant computing instance
AP1 . . . AP5 application program
PK1 . . . PK4 program complex
KD1 . . . KD13 configuration data
MB message broker
TG clock
VT voter
GW gateway
KN node
DD1 . . . DD4 diversity characteristic data
ZD count data
RD redundancy data
AD application data
DA data segment with application data
PA check data segment
ADS application data set
CDS encoded application data set
GR group
VR supply
COD encoding
DEC decoding
RE reading
WT writing
DTM_ZD determining step for count data
UPD_ZD updating step for count data
DEC_ADS decoding step for application data set
COD_ADS encoding step for application data set
TST_ZD checking step for count data
TST_DD checking step for diversity characteristic data
TST_RD checking step for redundancy data
DVG? query step for deviations
ERR_OT output step for errors
INI initialization step
RUN_APP execution step of application program
ZD_IN input step for count data
ZD_OT output step for count data
OT_RS output step for result
NW_ADS? query step of new application data set
DTM_PA determining step

The invention claimed is:

1. A method for computer-assisted operation of a memory unit, the method comprising:
    saving data in the memory unit and encoding the data prior to saving;
    retrieving the data from the memory unit and decoding the data after retrieval;
    monitoring the memory unit for errors by carrying out a temporal sequence of computer-assisted checking operations for the memory unit;
    for a first-time encoding of the data:
        generating or selecting at least one application data set containing a data segment having application data for an application program and a check data segment;
        writing count data that characterize a checking operation being implemented to the check data segment of each of the at least one application data set; and
        encoding and saving each of the at least one application data set;
    for checking the data in the checking operation being implemented, after retrieving and decoding the at least one application data set:
        determining an error for the at least one application data set when the count data characterizes neither the checking operation being implemented nor a most recent completely implemented checking operation;
        when no error was determined, occupying writing the count data that characterize the checking operation being implemented to the check data segment of the at least one application data set; and
        encoding and saving the at least one application data set if no error was determined.

2. The method according to claim 1, which comprises defining a start value for the count data before a first-time implementation of the checking operation.

3. The method according to claim 1, wherein the checking operation includes at least a checking of all application data sets available at a beginning of the checking operation for an ongoing method.

4. The method according to claim 1, which comprises, as soon as a checking operation has been completed, writing a count element to the count data that follows the count element for a previous occupation of the count data.

5. A method for computer-assisted execution of an application program, the method comprising:
    operating the memory unit by the method according to claim 1 and retrieving application data sets required for an execution from the memory unit and decoding the application data sets;
    after decoding the application data sets, executing the application program; and
    encoding and saving in the memory unit at least the application data sets, which include data segments that were changed or generated by the execution of the application program.

6. The method according to claim 5, which comprises, when checking the data after decoding of the application data sets and before execution of the application program, respectively:
    determining an error for an application data set when the count data characterizes neither the checking operation being implemented nor a most recent completely implemented checking operation;
    executing the application program if no error has been determined.

7. The method according to claim 5, which further comprises, during the computer-assisted operation of the memory unit, for the first-time encoding of the data:
    generating, or selecting from a supply of possible diversity characteristic data, at least one group of application data sets, containing data segments having identical application data for an application program and check data segments having different diversity characteristic data;

encoding and saving each application data set;

retrieving the data by retrieving and decoding the application data sets, and saving the data by encoding and saving the application data sets;

and/or during the computer-assisted execution, executing the application program multiple times in redundant computing instances, wherein in order to execute required application data sets, each application data set of an encoded group of application data sets is retrieved from the memory unit and decoded, wherein:

in order to check the data after the decoding of the application data sets, an error is determined respectively for an application data set if the diversity characteristic data in the application data set deviates from all possible diversity characteristic data of the computing instance from the supply;

executing the application program with the data segments of each application data set of a relevant group if no error was determined;

and/or encoding and saving in the memory unit at least those application data sets that include data segments that were changed or generated by the execution of the application program.

8. The method according to claim 5, which comprises, before encoding, creating the check data segment such that the check data segment also has redundant memory space with predefined redundancy data.

9. The method according to claim 5, wherein the data segments consist of data words.

10. The method according to claim 5, which comprises carrying out the method with simultaneous use of at least two processors or processing cores.

11. The method according to claim 10, wherein the at least two processors or processing cores have shared access to the memory unit.

12. The method according to claim 5, which comprises:

with multiply stored identical data segments and/or with multiply identical changed data segments, carrying out a voting process; and when an error is identified by the voting process, excluding from further processing those application data sets that contain data segments causative of the error identification.

13. The method according to claim 12, which comprises:

updating the application data sets, which contain data segments causative of errors with error-free data segments of the corresponding application data sets;

incorporating updated application data sets in further processing.

14. A computer program product having program commands for carrying out the method according to claim 1.

15. An apparatus for providing a computer program product, comprising a memory device for saving and/or providing a computer program product with program commands in non-transitory form for carrying out the method according to claim 1.

* * * * *

UNITED STATES PATENT AND TRADEMARK OFFICE
CERTIFICATE OF CORRECTION

PATENT NO. : 11,876,533 B2
APPLICATION NO. : 18/305531
DATED : January 16, 2024
INVENTOR(S) : Andreas Schallenberg et al.

It is certified that error appears in the above-identified patent and that said Letters Patent is hereby corrected as shown below:

In the Claims

Claim 1, Column 26, Lines 22-25 should read as follows:
when no error was determined, writing the count data that characterize the checking operation being implemented to the check data segment of the at least one application data set; and Signed and Sealed this
Twenty-seventh Day of February, 2024

Katherine Kelly Vidal
*Director of the United States Patent and Trademark Office*